United States Patent
Faibish et al.

(10) Patent No.: US 10,613,760 B2
(45) Date of Patent: Apr. 7, 2020

(54) TECHNIQUES FOR ASSESSING DATA REDUCTION EFFICIENCY

(71) Applicant: EMC IP Holding Company LLC, Hopkinton, MA (US)

(72) Inventors: Sorin Faibish, Newton, MA (US); Ivan Bassov, Brookline, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 63 days.

(21) Appl. No.: 16/035,867

(22) Filed: Jul. 16, 2018

(65) Prior Publication Data

US 2020/0019310 A1  Jan. 16, 2020

(51) Int. Cl.
| | |
|---|---|
| *G06F 12/00* | (2006.01) |
| *G06F 13/00* | (2006.01) |
| *G06F 3/06* | (2006.01) |
| *H03M 7/30* | (2006.01) |
| *G06F 16/174* | (2019.01) |

(52) U.S. Cl.
CPC .............. *G06F 3/061* (2013.01); *G06F 3/067* (2013.01); *G06F 3/0655* (2013.01); *G06F 16/1748* (2019.01); *H03M 7/3091* (2013.01)

(58) Field of Classification Search
CPC .. G06F 3/0608; G06F 6/1748; G06F 16/1744; G06F 3/0655; G06F 16/174
See application file for complete search history.

(56) References Cited

U.S. PATENT DOCUMENTS

| | | | |
|---|---|---|---|
| 8,959,124 B2* | 2/2015 | Cashman .............. | G06F 3/0641 707/812 |
| 10,268,381 B1* | 4/2019 | Armangau ............ | G06F 3/0608 |
| 2013/0080408 A1* | 3/2013 | Cashman .............. | G06F 3/0608 707/692 |
| 2018/0241777 A1* | 8/2018 | Best ........................ | H04L 63/20 |
| 2019/0318016 A1* | 10/2019 | Bassov ................. | G06F 16/178 |
| 2019/0340136 A1* | 11/2019 | Irwin .................... | G06F 3/0608 |

* cited by examiner

*Primary Examiner* — Sean D Rossiter
(74) *Attorney, Agent, or Firm* — Muirhead and Saturnelli, LLC

(57) ABSTRACT

Techniques for determining data reduction options may include: receiving data reduction statistics for a data set including a first value of a first statistic denoting an amount of data reduction obtained for the data set when compression is enabled, a second value of a second statistic denoting an amount of data reduction obtained for the data set when deduplication is enabled, and a third value of a third statistic denoting an overlap in data reduction contribution when both compression and deduplication are enabled; and determining, in accordance with the data reduction statistics, a first setting denoting a current data reduction option enabled for the data set. A Venn diagram provided on a user interface display may illustrate data reduction benefits for the data set based on the data reduction statistics. Data reduction benefits for the data set may be reassessed to determine whether to modify the current data reduction option.

20 Claims, 8 Drawing Sheets

TECHNIQUES FOR ASSESSING DATA REDUCTION EFFICIENCY

BACKGROUND

Technical Field

This application generally relates to performing data reduction and, in particular, assessing data reduction efficiency and selectively activating or enabling one or more particular data reduction techniques.

Description of Related Art

Systems may include different resources used by one or more host processors. Resources and host processors in the system may be interconnected by one or more communication connections, such as network connections. These resources may include, for example, data storage devices such as those included in the data storage systems manufactured by Dell EMC™. These data storage systems may be coupled to one or more host processors and provide storage services to each host processor. Multiple data storage systems from one or more different vendors may be connected and may provide common data storage for one or more host processors in a computer system.

A host may perform a variety of data processing tasks and operations using the data storage system. For example, a host may issue I/O operations, such as data read and write operations, received at a data storage system. Host systems may store and retrieve data by issuing the I/O operations to the data storage system containing a plurality of host interface units, disk drives (or more generally storage devices), and disk interface units. Such data storage systems are provided, for example, by Dell EMC™. The host systems access the storage devices through a plurality of channels provided therewith. Host systems provide data and access control information through the channels to a storage device of the data storage system and data of the storage device is also provided from the data storage system to the host systems also through the channels. The host systems do not address the disk drives of the data storage system directly, but rather, access what appears to the host systems as a plurality of files, objects, logical units, logical devices or logical volumes. Thus, the I/O operations issued by the host may be directed to a particular storage entity, such as a file or logical device. The logical devices may or may not correspond to the actual physical drives. Allowing multiple host systems to access the single data storage system allows the host systems to share data stored therein.

SUMMARY OF THE INVENTION

In accordance with one aspect of the techniques herein is a method of determining data reduction options for data sets comprising: receiving a first plurality of data reduction statistics for a first data set, the first plurality of data reduction statistics including a first value of a first statistic denoting an amount of data reduction obtained for the first data set when compression is enabled, a second value of a second statistic denoting an amount of data reduction obtained for the first data set when deduplication is enabled, and a third value of a third statistic denoting an overlap in data reduction contribution when both compression and deduplication are enabled; and determining, in accordance with the first plurality of data reduction statistics for the first data set, a first setting denoting a current data reduction option enabled for the first data set. The method may include: determining, in accordance with the first plurality of data reduction statistics for the first data set, a first option of a plurality of different data reduction options that results in a maximum data reduction of the first data set; and setting the first setting to the first option thereby denoting that the first option is the current data reduction option enabled for the first data set. The plurality of different data reduction options may include enabling only compression without deduplication, enabling only deduplication without compression, enabling both compression and deduplication, and disabling both deduplication and compression. The first setting may denote whether deduplication is currently enabled or disabled for the first data set and denotes whether compression is currently enabled or disabled for the first data set. Deduplication when enabled may be performed as processing of an I/O path when writing to the first data set, and compression when enabled may be performed as processing of the I/O path when writing to the first data set. The method may include: displaying, on a user interface, a diagram illustrating data reduction benefits for the first data set, the diagram including a first element representing the first value of the first statistic, a second element representing the second value for the second statistic and a third element representing the third value for the third statistic; providing, in accordance with the first plurality of data reduction statistics for the first data set, a recommended data reduction option for the first data set; and receiving, via the user interface, a first input identifying the first setting as the current data reduction option selected for the first data set. The recommended data reduction option may be selected from a plurality of different data reduction options and wherein the recommended data reduction option may be determined, in accordance with the first plurality of data reduction statistics, as having a maximum data reduction effect on the first data set with respect to the plurality of different data reduction options. The first plurality of data reduction statistics may include a fourth value denoting a compression ratio for the first data set and a fifth value denoting a deduplication ratio for the first data set. The method may include determining the fourth value denoting compression ratio and the fifth value denoting a deduplication ratio using at least one of: a tool that scans at least part of the first data set, and information collected as a result of write I/Os issued on an I/O path of the first data set. The method may include calculating the third value of the third statistic, denoting an overlap in data reduction contribution when both compression and deduplication are enabled, using the fourth value denoting the compression ratio for the first data set and the fifth value denoting the deduplication ratio for the first data set. The method may include: calculating the first value for the first statistic using the fourth value denoting the compression ratio for the first data set; and calculating the second value for the second statistic using the fifth value denoting the deduplication ratio for the first data set. The first setting may denote the current data reduction option enabled for the first data set at a first point in time. The method may include: determining, at a second point in time subsequent to the first point in time, a second plurality of data reduction statistics for the first data set, wherein the second plurality of data reduction statistics includes a second plurality of values for the first statistic, the second statistic, the third statistic, the compression ratio and the decompression ratio; detecting, at the second point in time with respect to the first point in time, a change in data reduction benefit denoted by at least one of the second plurality of data reduction statistics for the first data set; and determining, in accordance with the change detected and in accordance with the second plurality of data reduction statistics for the first data set, a second setting denoting a revised setting of the current data reduction option enabled for the first data set at the second point in time. The method may include: displaying, on a user interface, a diagram illustrating data reduction benefits for the first data set at the second point in time, the diagram including a plurality of elements denoting values of the second plurality of values for the first statistic, the second statistic and the third statistic; providing, in accordance with the second plurality of data reduction statistics for the first data set, a recommended data reduction option for the first data set; and receiving, via the user interface, a first input identifying the second setting as the revised setting of the current data reduction option enabled for the first data set at the second point in time. The method may include: selecting an entry from a table, wherein the entry identifies a data set type matching the first data set; and using predetermined values for data reduction statistics associated with the first entry as data values for the data reduction statistics included in the first plurality of data reduction statistics for a first data set.

In accordance with another aspect of techniques herein is a system comprising: one or more processors; and a memory comprising code stored thereon that, when executed, perform a method of determining data reduction options for data sets comprising: receiving a first plurality of data reduction statistics for a first data set, the first plurality of data reduction statistics including a first value of a first statistic denoting an amount of data reduction obtained for the first data set when compression is enabled, a second value of a second statistic denoting an amount of data reduction obtained for the first data set when deduplication is enabled, and a third value of a third statistic denoting an overlap in data reduction contribution when both compression and deduplication are enabled; and determining, in accordance with the first plurality of data reduction statistics for the first data set, a first setting denoting a current data reduction option enabled for the first data set.

In accordance with another aspect of techniques herein is a computer readable medium comprising code stored thereon that, when executed, performs a method of determining data reduction options for data sets comprising: receiving a first plurality of data reduction statistics for a first data set, the first plurality of data reduction statistics including a first value of a first statistic denoting an amount of data reduction obtained for the first data set when compression is enabled, a second value of a second statistic denoting an amount of data reduction obtained for the first data set when deduplication is enabled, and a third value of a third statistic denoting an overlap in data reduction contribution when both compression and deduplication are enabled; and determining, in accordance with the first plurality of data reduction statistics for the first data set, a first setting denoting a current data reduction option enabled for the first data set. The method may include: determining, in accordance with the first plurality of data reduction statistics for the first data set, a first option of a plurality of different data reduction options that results in a maximum data reduction of the first data set; and setting the first setting to the first option thereby denoting that the first option is the current data reduction option enabled for the first data set. The plurality of different data reduction options may include enabling only compression without deduplication, enabling only deduplication without compression, enabling both compression and deduplication, and disabling both deduplication and compression. The first setting may denote whether deduplication is currently enabled or disabled for the first data set and denotes whether compression is currently enabled or disabled for the first data set. Deduplication when enabled may be performed as processing of an I/O path when writing to the first data set, and compression when enabled may be performed as processing of the I/O path when writing to the first data set. The method may include: displaying, on a user interface, a diagram illustrating data reduction benefits for the first data set, the diagram including a first element representing the first value of the first statistic, a second element representing the second value for the second statistic and a third element representing the third value for the third statistic; providing, in accordance with the first plurality of data reduction statistics for the first data set, a recommended data reduction option for the first data set; and receiving, via the user interface, a first input identifying the first setting as the current data reduction option selected for the first data set.

BRIEF DESCRIPTION OF THE DRAWINGS

Features and advantages of the present invention will become more apparent from the following detailed description of exemplary embodiments thereof taken in conjunction with the accompanying drawings in which.

DETAILED DESCRIPTION OF
EMBODIMENT(S)

Figure 1:
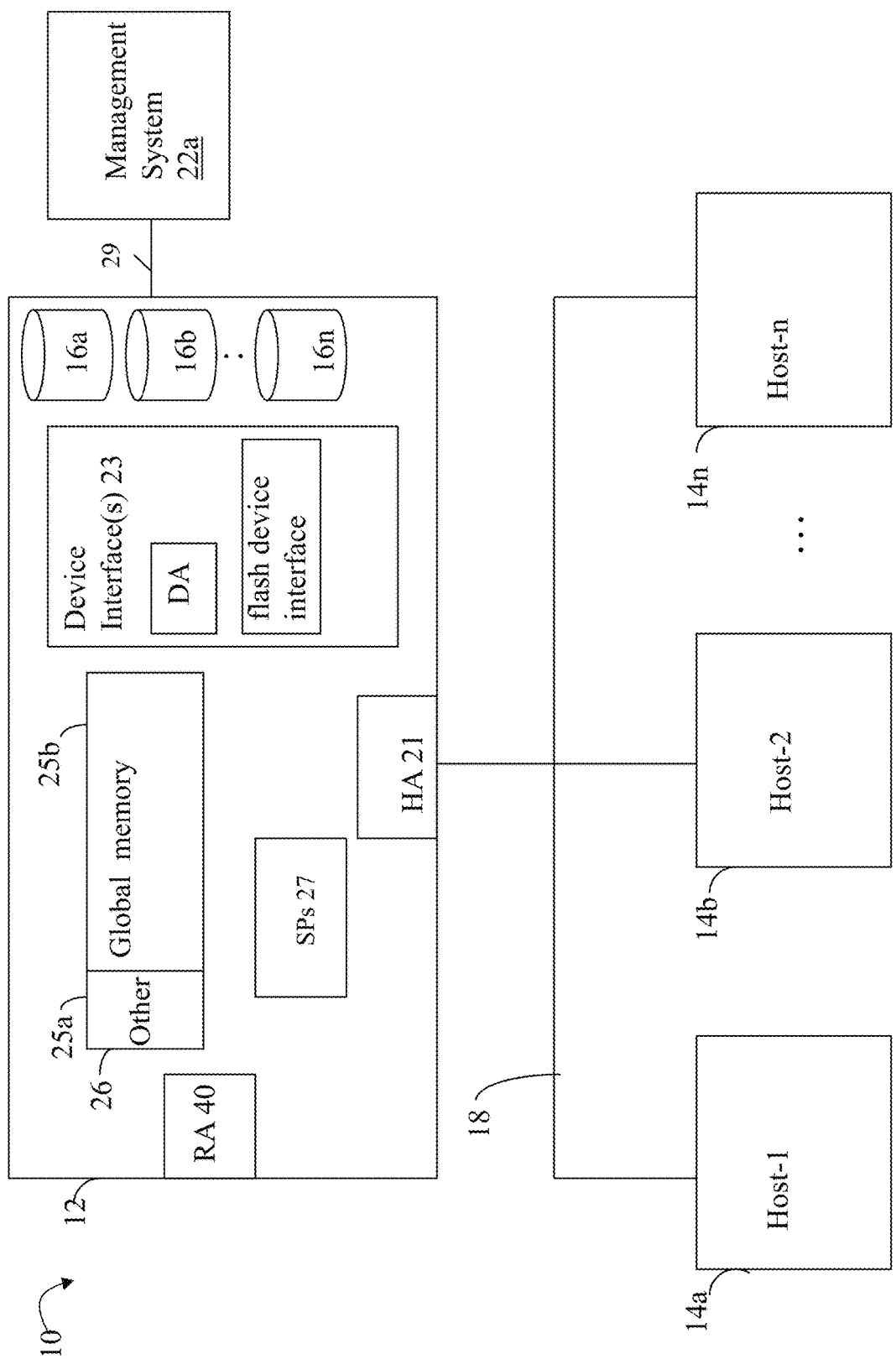
FIGS. 1 and 2B are examples of components that may be included in a system in accordance with techniques described herein.

Referring to FIG. 1, shown is an example of an embodiment of a system that may be used in connection with performing the techniques described herein. The system 10 includes a data storage system 12 connected to host systems 14a-14n through communication medium 18. In this embodiment of the computer system 10, and the n hosts 14a-14n may access the data storage system 12, for example, in performing input/output (I/O) operations or data requests. The communication medium 18 may be any one or more of a variety of networks or other type of communication connections as known to those skilled in the art. The communication medium 18 may be a network connection, bus, and/or other type of data link, such as a hardwire or other connections known in the art. For example, the communication medium 18 may be the Internet, an intranet, network (including a Storage Area Network (SAN)) or other wireless or other hardwired connection(s) by which the host systems 14a-14n may access and communicate with the data storage system 12, and may also communicate with other components included in the system 10.

Each of the host systems 14a-14n and the data storage system 12 included in the system 10 may be connected to the communication medium 18 by any one of a variety of connections as may be provided and supported in accordance with the type of communication medium 18. The processors included in the host computer systems 14a-14n may be any one of a variety of proprietary or commercially available single or multi-processor system, such as an Intel-based processor, or other type of commercially available processor able to support traffic in accordance with each particular embodiment and application.

It should be noted that the particular examples of the hardware and software that may be included in the data storage system 12 are described herein in more detail, and may vary with each particular embodiment. Each of the host computers 14a-14n and data storage system may all be located at the same physical site, or, alternatively, may also be located in different physical locations. Examples of the communication medium that may be used to provide the different types of connections between the host computer systems and the data storage system of the system 10 may use a variety of different communication protocols such as block-based protocols (e.g., SCSI, Fibre Channel, iSCSI), file system-based protocols (e.g., NFS), and the like. Some or all of the connections by which the hosts and data storage system may be connected to the communication medium may pass through other communication devices, such switching equipment that may exist such as a phone line, a repeater, a multiplexer or even a satellite.

Each of the host computer systems may perform different types of data operations in accordance with different types of tasks. In the embodiment of FIG. 1, any one of the host computers 14a-14n may issue a data request to the data storage system 12 to perform a data operation. For example, an application executing on one of the host computers 14a-14n may perform a read or write operation resulting in one or more data requests to the data storage system 12.

It should be noted that although element 12 is illustrated as a single data storage system, such as a single data storage array, element 12 may also represent, for example, multiple data storage arrays alone, or in combination with, other data storage devices, systems, appliances, and/or components having suitable connectivity, such as in a SAN (storage area network) or LAN (local area network), in an embodiment using the techniques herein. It should also be noted that an embodiment may include data storage arrays or other components from one or more vendors. In subsequent examples illustrated the techniques herein, reference may be made to a single data storage array by a vendor, such as by Dell EMC™. However, as will be appreciated by those skilled in the art, the techniques herein are applicable for use with other data storage arrays by other vendors and with other components than as described herein for purposes of example.

The data storage system 12 may be a data storage appliance or a data storage array including a plurality of data storage devices 16a-16n. The data storage devices 16a-16n may include one or more types of data storage devices such as, for example, one or more rotating disk drives and/or one or more solid state drives (SSDs). An SSD is a data storage device that uses solid-state memory to store persistent data. An SSD using SRAM or DRAM, rather than flash memory, may also be referred to as a RAM drive. SSD may refer to solid state electronics devices as distinguished from electromechanical devices, such as hard drives, having moving parts. Flash devices or flash memory-based SSDs are one type of SSD that contains no moving mechanical parts. The flash devices may be constructed using nonvolatile semiconductor NAND flash memory.

The data storage array may also include different types of adapters or directors, such as an HA 21 (host adapter), RA 40 (remote adapter), and/or device interface 23. Each of the adapters may be implemented using hardware including a processor with local memory with code stored thereon for execution in connection with performing different operations. The HAs may be used to manage communications and data operations between one or more host systems and the global memory (GM). In an embodiment, the HA may be a Fibre Channel Adapter (FA) or other adapter which facilitates host communication. The HA 21 may be characterized as a front end component of the data storage system which receives a request from the host. The data storage array may include one or more RAs that may be used, for example, to facilitate communications between data storage arrays. The data storage array may also include one or more device interfaces 23 for facilitating data transfers to/from the data storage devices 16a-16n. The data storage interfaces 23 may include device interface modules, for example, one or more disk adapters (DAs) (e.g., disk controllers), adapters used to interface with the flash drives, and the like. The DAs may also be characterized as back end components of the data storage system which interface with the physical data storage devices.

One or more internal logical communication paths may exist between the device interfaces 23, the RAs 40, the HAs 21, and the memory 26. An embodiment, for example, may use one or more internal busses and/or communication modules. For example, the global memory portion 25b may be used to facilitate data transfers and other communications between the device interfaces, HAs and/or RAs in a data storage array. In one embodiment, the device interfaces 23 may perform data operations using a system cache that may be included in the global memory 25b, for example, when communicating with other device interfaces and other components of the data storage array. The other portion 25a is that portion of memory that may be used in connection with other designations that may vary in accordance with each embodiment.

The particular data storage system as described in this embodiment, or a particular storage device thereof, such as a disk or particular aspects of a flash device, should not be construed as a limitation. Other types of commercially available data storage systems, as well as processors and hardware controlling access to these particular devices, may also be included in an embodiment.

Host systems provide data and access control information through channels to the storage systems, and the storage systems may also provide data to the host systems also through the channels. The host systems do not address the drives or devices 16a-16n of the storage systems directly, but rather access to data may be provided to one or more host systems from what the host systems view as a plurality of logical devices, logical volumes (LVs) which may also referred to herein as logical units (e.g., LUNs). A logical unit (LUN) may be characterized as a data storage array reference or data storage system reference to an amount of disk space that has been formatted and allocated for use to one or more hosts. A logical unit may have a logical unit number that is an I/O address for the logical unit. As used herein, a LUN or LUNs may refer to the different logical units of storage which may be referenced by such logical unit numbers. The LUNs may or may not correspond to the actual or physical disk drives or more generally physical storage devices. For example, one or more LUNs may reside on a single physical disk drive, data of a single LUN may reside on multiple different physical devices, and the like.

Data in a single data storage system, such as a single data storage array, may be accessed by multiple hosts allowing the hosts to share the data residing therein. The HAs may be used in connection with communications between a data storage array and a host system. The RAs may be used in facilitating communications between two data storage arrays. The DAs may be one type of device interface used in connection with facilitating data transfers to/from the associated disk drive(s) and LUN (s) residing thereon. A flash device interface may be another type of device interface used in connection with facilitating data transfers to/from the associated flash devices and LUN(s) residing thereon. It should be noted that an embodiment may use the same or a different device interface for one or more different types of devices than as described herein.

In an embodiment in accordance with techniques herein, the data storage system as described may be characterized as having one or more logical mapping layers in which a logical device of the data storage system is exposed to the host whereby the logical device is mapped by such mapping layers of the data storage system to one or more physical devices. Additionally, the host may also have one or more additional mapping layers so that, for example, a host side logical device or volume is mapped to one or more data storage system logical devices as presented to the host.

It should be noted that although examples of techniques herein may be made with respect to a physical data storage system and its physical components (e.g., physical hardware for each HA, DA, HA port and the like), techniques herein may be performed in a physical data storage system including one or more emulated or virtualized components (e.g., emulated or virtualized ports, emulated or virtualized DAs or HAs), and also a virtualized or emulated data storage system including virtualized or emulated components.

Also shown in FIG. 1 is a management system 22a that may be used to manage and monitor the system 12. In one embodiment, the management system 22a may be a computer system which includes data storage system management software or application such as may execute in a web browser. A data storage system manager may, for example, view information about a current data storage configuration such as LUNs, storage pools, and the like, on a user interface (UI) in a display device of the management system 22a. Alternatively, and more generally, the management software may execute on any suitable processor in any suitable system. For example, the data storage system management software may execute on a processor of the data storage system 12.

It should be noted that each of the different adapters, such as HA 21, DA or disk interface, RA, and the like, may be implemented as a hardware component including, for example, one or more processors, one or more forms of memory, and the like. Code may be stored in one or more of the memories of the component for performing processing.

The device interface, such as a DA, performs I/O operations on a physical device or drive 16a-16n. In the following description, data residing on a LUN may be accessed by the device interface following a data request in connection with I/O operations. For example, a host may issue an I/O operation which is received by the HA 21. The I/O operation may identify a target location from which data is read from, or written to, depending on whether the I/O operation is, respectively, a read or a write operation request. The target location of the received I/O operation may be expressed in terms of a LUN and logical address or offset location (e.g., LBA or logical block address) on the LUN. Processing may be performed on the data storage system to further map the target location of the received I/O operation, expressed in terms of a LUN and logical address or offset location on the LUN, to its corresponding physical storage device (PD) and location on the PD. The DA which services the particular PD may further perform processing to either read data from, or write data to, the corresponding physical device location for the I/O operation.

It should be noted that an embodiment of a data storage system may include components having different names from that described herein but which perform functions similar to components as described herein. Additionally, components within a single data storage system, and also between data storage systems, may communicate using any suitable technique that may differ from that as described herein for exemplary purposes. For example, element 12 of FIG. 1 may be a data storage system, such as the Dell EMC Unity® data storage system, that includes multiple storage processors (SPs). Each of the SPs 27 may be a CPU including one or more "cores" or processors and each may have their own memory used for communication between the different front end and back end components rather than utilize a global memory accessible to all storage processors. In such embodiments, memory 26 may represent memory of each such storage processor.

Generally, techniques herein may be used in connection with any suitable storage system, appliance, device, and the like, in which data is stored. For example, an embodiment may implement techniques herein using a midrange data storage system, such as a Dell EMC Unity® data storage system, as well as a high end or enterprise data storage system, such as a Dell EMC™ PowerMAX™ data storage system.

The data path or I/O path may be characterized as the path or flow of I/O data through a system. For example, the data or I/O path may be the logical flow through hardware and software components or layers in connection with a user, such as an application executing on a host (e.g., more generally, a data storage client) issuing I/O commands (e.g., SCSI-based commands, and/or file-based commands) that read and/or write user data to a data storage system, and also receiving a response (possibly including requested data) in connection such I/O commands.

The control path, also sometimes referred to as the management path, may be characterized as the path or flow of data management or control commands through a system. For example, the control or management path may be the logical flow through hardware and software components or layers in connection with issuing data storage management command to and/or from a data storage system, and also receiving responses (possibly including requested data) to such control or management commands. For example, with reference to FIG. 1, the control commands may be issued from data storage management software executing on management system 22a to the data storage system 12. Such commands may be, for example, to establish or modify data services, provision storage, perform user account management, and the like. For example, commands may be issued over the control path to provision storage for LUNs, create a snapshot, define conditions of when to create another snapshot, define or establish local and/or remote replication services, define or modify a schedule for snapshot or other data replication services, define a RAID group, obtain data storage management and configuration information for display in a graphical user interface (GUI) of a data storage management program or application, generally modify one or more aspects of a data storage system configuration, list properties and status information regarding LUNs or other storage objects (e.g., physical and/or logical entities in the data storage system), and the like.

The data path and control path define two sets of different logical flow paths. In at least some of the data storage system configurations, at least part of the hardware and network connections used for each of the data path and control path may differ. For example, although both control path and data path may generally use a network for communications, some of the hardware and software used may differ. For example, with reference to FIG. 1, a data storage system may have a separate physical connection 29 from a management system 22a to the data storage system 12 being managed whereby control commands may be issued over such a physical connection 29. However, it may be that user I/O commands are never issued over such a physical connection 29 provided solely for purposes of connecting the management system to the data storage system. In any case, the data path and control path each define two separate logical flow paths.

An embodiment of a data storage system in accordance with techniques herein may perform different data processing operations or services on stored user data. For example, the data storage system may perform one or more data reduction operations, such as data deduplication and compression, as well as other types of operations or services, such as encryption. Such data reduction operations attempt to reduce the amount of storage needed for storing data on non-volatile backend storage devices with the goal of reducing the cost per unit of storage consumed (e.g., dollar cost per GB of storage). Generally, data deduplication and compression techniques are known in the art and any suitable such technique may be used in an embodiment in accordance with techniques herein. In at least one embodiment, the compression technique may be a lossless compression technique such as an algorithm from the Lempel Ziv algorithm family (e.g., LZ77, LZ78, LZW, LZR, and the like). In at least one embodiment in accordance with techniques herein, data deduplication processing performed may include digest or hash value computation using an algorithm such as based on the SHA-256 hashing algorithm known in the art. Data deduplication generally refers to removing redundant or duplicate data portions. Data deduplication techniques may include looking for duplicate data blocks or chunks whereby only a single instance of the data block or chunk is retained (stored on physical storage) and where pointers or references may be used in connection with duplicate or redundant copies (which reference or identify the single stored instance of the data block).

Figure 2A:
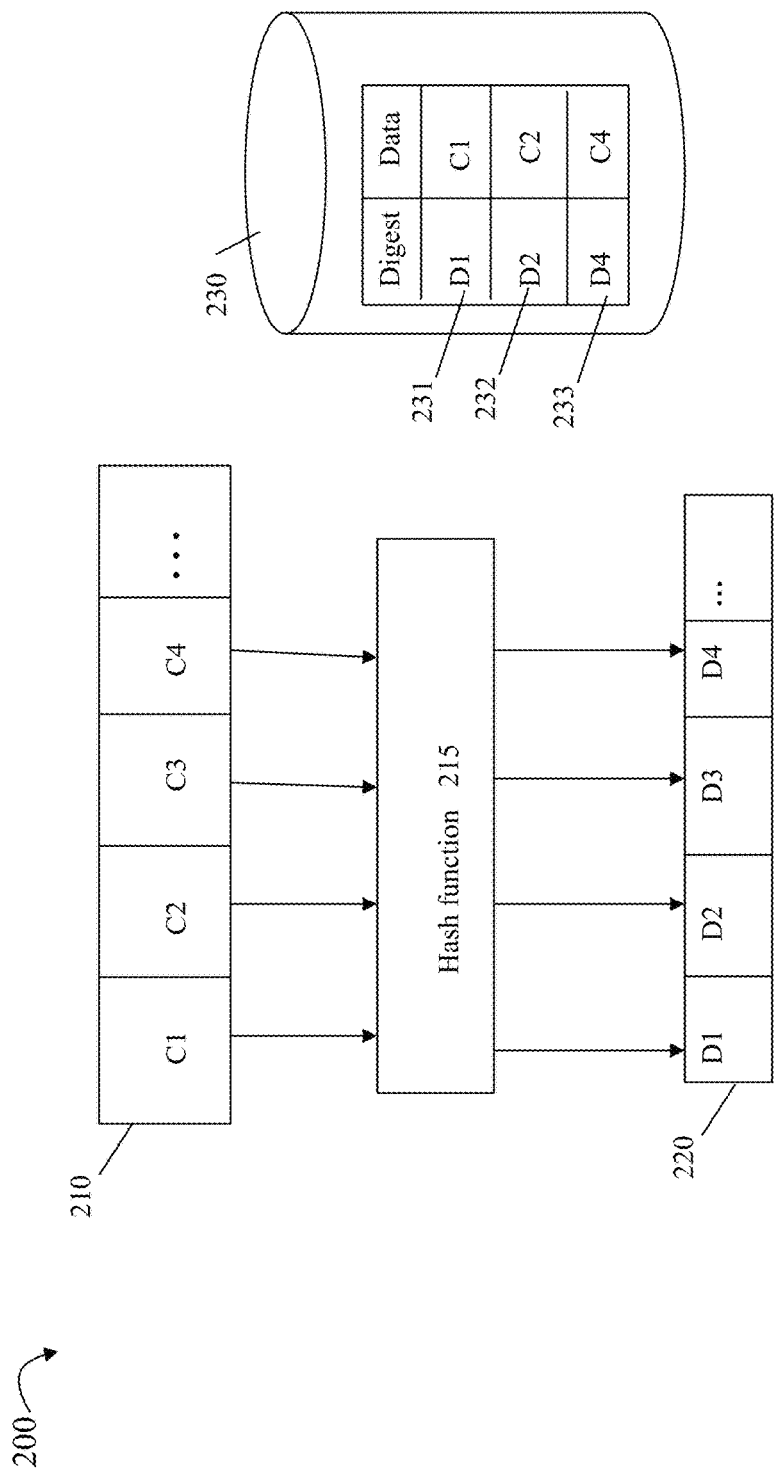
FIG. 2A is an example illustrating data deduplication as may be performed in an embodiment in accordance with techniques herein.

Referring to FIG. 2A, shown is an example 200 illustrating processing that may be performed in connection with data deduplication processing in an embodiment in accordance with techniques herein. Element 210 may denote the original data being written or stored on back-end non-volatile storage. The original data may be partitioned into multiple data blocks or chunks C1, C2, C3, C4 and the like. In at least one embodiment and for purposes of illustration, the data chunks may all be the same size where the size may vary with embodiment. As a variation depending on the data deduplication technique utilized, the chunks of 210 may be of varying or different sizes. Each chunk is provided as an input to hash function 215. As noted above, in at least one embodiment, the hash function 215 may be the SHA-256 hashing algorithm, or more generally, any suitable cryptographic hashing function known in the art. For each chunk of 210, the hash function 215 may perform processing and generate, as an output, a hash value or digest. Element 220 includes digests D1, D2, D3, D4, and the like, where a corresponding different one of the digests DN is generated for one of the chunks CN (where "N" is an integer denoting the chunk and associated digest generated for that chunk). For example, D1 is the digest generated for C1, D2 is the digest generated for C2, D3 is the digest generated for C3, and so on. Generally, a hash function 215 is selected which has an acceptably low probability of a "hash collision" of generating the same digest or hash value for two different chunks. The strength of the hash function 215 may be measured by the unlikelihood of a collision occurring two different input chunks of data produce the same digest. The strength increases with the bit length of the hash value or digest. Thus, if two chunks, such as C1 and C3, have the same digests whereby D1=D3, then chunks C1 and C3 match (e.g., are identical matching data chunks or blocks). If two chunks, such as C1 and C4, have different digests whereby D1 does not equal D4, then chunks C1 and C4 do not match (e.g., are different or non-matching data chunks or blocks). In cases where two matching or identical chunks have the same digest, only a single copy of the data chunk is stored on backend non-volatile physical storage of the data storage system. The single stored instance of the data chunk may be referenced using a pointer, handle, the digest of the chunk, and the like.

Element 230 of FIG. 2A may denote the data store used to store data chunks. In this example, as noted above, assume chunks C1 and C3 are the same with remaining chunks C2 and C4 being unique. The data store 230 may also be referred to as a single instance store (SIS). In at least one embodiment, element 230 may be organized and managed using a data structure, such as a hash table. In at least one embodiment, computed digests may be used as an index into the hash table where the single unique instances of data chunks may be stored (along with other metadata as may be needed for maintaining the table and also in accordance with the particular hash table management used in an embodiment). Hash tables are data structures known in the art. A hash table uses a hash function to compute an index into an array of buckets or slots, from which the desired data can be found. In this example, the chunk of data may be mapped by hash function 215, and thus by the chunk's digest, to a particular entry in the table at which the chunk data is stored. To further illustrate, the hash function 215 may be used to generate a digest for a particular data chunk. The digest is then further mapped (e.g., such as by another mathematical function, using particular portions of the digest, and the like) to a particular index or entry of the hash table. The particular mapping used to map the digest to a corresponding table entry varies, for example, with the digest and the size of hash table.

When storing a new data chunk, such as C1, its digest may be mapped to a particular hash table entry 231 whereby if the table entry is null/empty, or otherwise does not already include a data chunk matching C1, then C1 is stored in the table entry along with its associated digest D1 (this is the first time chunk C1 is recorded in the data store 230). Otherwise, if there is already an existing entry in the table including a data chunk matching C1, it indicates that the new data chunk is a duplicate of an existing chunk. In this example as noted above, processing is performed for C1, C2, and C4 respectively, where entries 231, 232, and 233 are added since there are no existing matching entries in the hash table. When processing chunk C3, as noted above, C3 has a digest D3 matching D1 whereby C3 (and thus D3) maps to entry 231 of the hash table already including a matching chunk C1 (so no additional data chunk is added to 230 for C3 since C3 is determined as a duplicate of C1). In connection with representing a particular file or other storage entity including multiple duplicate occurrences of a particular chunk such as C3, the single instance or copy of the data may be stored in 230. Additionally, a handle or reference, such as identifying the hash table entry 231, its digest, and the like, may be used to reference the single instance or copy of the data storage in 230. When reconstructing or restoring data such as the file to its original form, the handle or reference into the hash table for chunk C3 may be used to obtain the actual C3 chunk of data from 230.

Figure 2B:
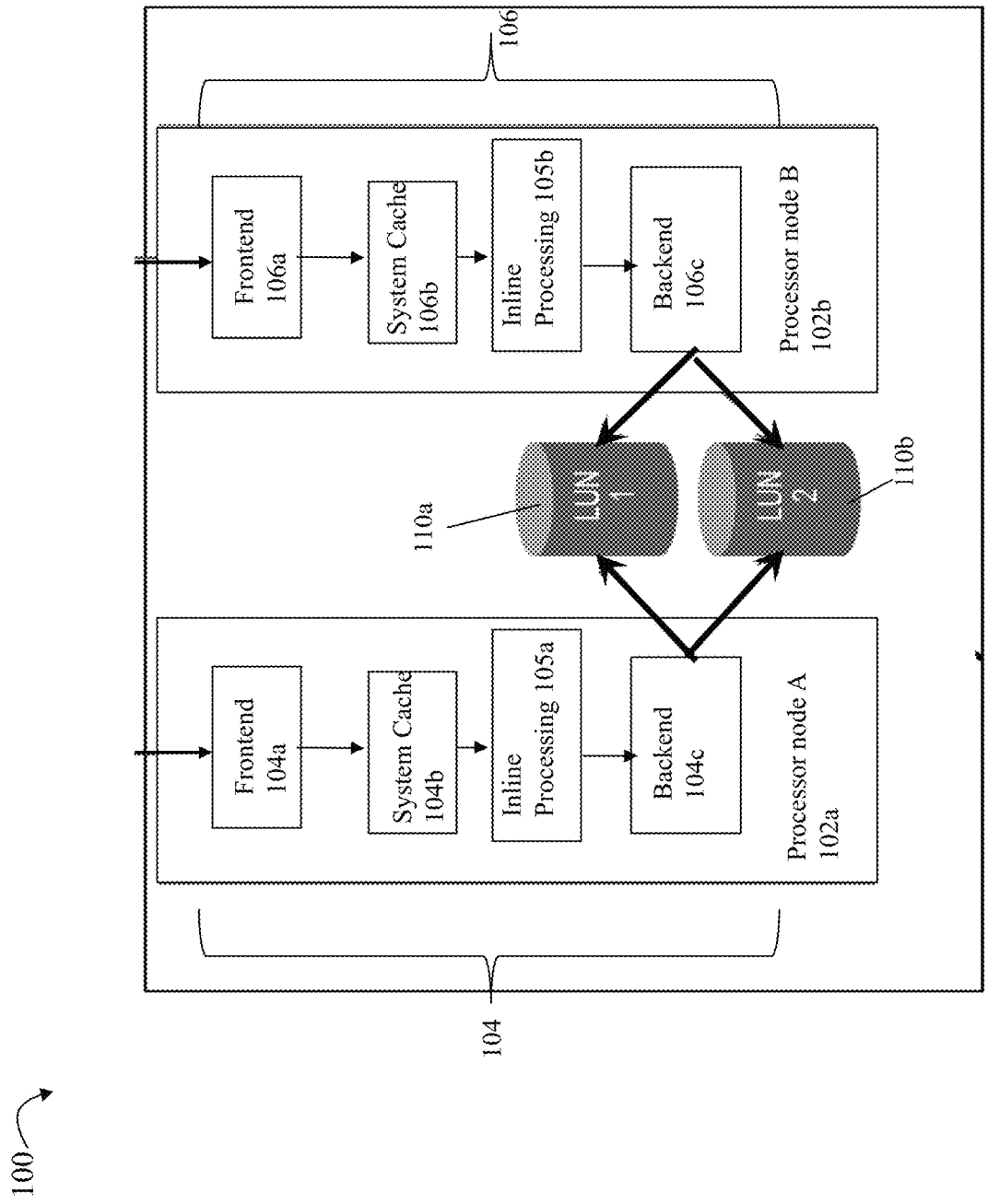

With reference to FIG. 2B, shown is an example 100 illustrating components that may be included in the data path in at least one existing data storage system in accordance with techniques herein. The example 100 includes two processor nodes A 102a and B 102b and associated software stacks 104, 106 of the data path where I/O requests may be received by either processor node 102a or 102b. In the example 200, the data path 104 of processor node A 102a includes: the frontend (FE) component 104a (e.g., an FA or front end adapter) that translates the protocol-specific request into a storage system-specific request; a system cache layer 104b where data is temporarily stored; an inline processing layer 105a; and a backend (BE) component 104c that facilitates movement of the data between the system cache and permanent non-volatile storage (e.g., back end physical non-volatile storage devices accessed by BE components such as DAs as described herein). During movement of data in and out of the system cache layer 104b (e.g., such as in connection with read and writing data respectively, to physical storage 110a, 110b (e.g., PDs), inline processing may be performed by layer 105a. Such inline processing operations of 105a may be optionally performed and may include any one of more data processing operations in connection with data that is flushed from system cache layer 104b to back-end non-volatile physical storage 110a, 110b, as well as when retrieving data from back-end non-volatile physical storage 110a, 110b to be stored in system cache layer 104b. In at least one embodiment, the inline processing may include performing compression and/or data duplication.

In a manner similar to that as described for data path 104, the data path 106 for processor node B 102b has its own FE component 106a, system cache layer 106b, inline processing layer 105b, and BE component 106c that are respectively similar to components 104a, 104b, 105a and 104c. Elements 110a, 110b denote physical storage provisioned for LUNs whereby an I/O may be directed to a location or logical address to read data from, or write data to, the logical address. The LUNs 110a, 110b are examples of storage objects representing logical storage entities included in an existing data storage system configuration. Since, in this example, writes directed to LUNs 110a, 110b may be received for processing by either of the nodes 102a and 102b, the example 100 illustrates what may also be referred to as an active-active configuration.

In connection with a write operation as may be received from a host and processed by processor node A 102a, the write data may be written to the system cache 104b, marked as write pending (WP) denoting it needs to be written to physical storage 110a, 110b and, at a later point in time, the write data may be destaged or flushed from the system cache to the physical storage 110a, 110b by the BE component 104c. The write request may be considered complete once the write data has been stored in the system cache whereby an acknowledgement regarding the completion may be returned the host (e.g., by component 104a). At various points in time, WP data stored in the system cache is flushed or written out to physical storage 110a, 110b.

In connection with inline processing layer 105a, prior to storing the original data on physical storage 110a, 110b, compression and data deduplication processing may be performed that converts the original data (as stored in the system cache prior to inline processing) to a resulting form (that may include compressed and/or deduplicated portions) which is then written to physical storage 110a, 110b. In at least one embodiment in which both deduplication and compression are enabled for use in connection with writing data, when deduplication processing determines that a portion (such as a block or chunk) of the original data is a duplicate of an existing data portion already stored on 110a, 110b, that particular portion of the original data is not stored in a compressed form and may rather be stored in its deduplicated form (e.g., there is no need for compression of a chunk determined to be duplicate of another existing chunk). As a variation, an embodiment in accordance with techniques herein may only enable compression/decompression without enabling data deduplication. As yet another variation, an embodiment in accordance with techniques herein may only enable data deduplication without enabling compression/decompression.

In connection with a read operation to read a block or chunk of data, a determination is made as to whether the requested read data block is stored in its original form (in system cache 104b or on physical storage 110a, 110b), or whether the requested read data block was previously deduplicated or compressed. If the requested read data block (which is stored in its original decompressed, non-deduplicated form) is in system cache, the read data block is retrieved from the system cache 104b and returned to the host. Otherwise, if the requested read data block is not in system cache 104b but is stored on physical storage 110a, 110b in its original form, the requested data block is read by the BE component 104c from the backend storage 110a, 110b, stored in the system cache and then returned to the host.

If the requested read data block was previously deduplicated, the read data block is recreated and stored in the system cache in its original form so that it can be returned to the host. If the requested read data was previously compressed, the block is first decompressed prior to sending the read data block to the host. If the compressed read data block is already stored in the system cache, the data is uncompressed to a temporary or buffer location, the uncompressed data is sent to the host, and the buffer or temporary location is released. If the compressed read data block is not in system cache but stored on physical storage 110a, 110b, the compressed read data block may be read from physical storage 110a, 110b into system cache, uncompressed to a buffer or temporary location, and then returned to the host. Thus, requested read data stored on physical storage 110a, 110b may be stored in a deduplicated or compressed form as noted above where processing is performed by 105a to restore or convert the deduplicated or compressed form of the data to its original data form prior to returning the requested read data to the host.

As noted above, inline compression (ILC) and inline data deduplication (ILD) may be performed as part of inline processing 105a, 105b. ILC and ILD are examples of data reduction techniques that provide the ability to reduce the amount of physical storage needed for storing user data on back-end PDs of the data storage system. As discussed above and elsewhere herein, ILC and ILD may be performed as part of the I/O or data path when writing data. CPU resources of the data storage system are utilized to perform such processing for compression and data deduplication when writing data on the I/O or data path (e.g., as part of inline processing). In at least one embodiment, data reduction may be enabled by default and the user may be provided the ability to decide which storage objects or storage entities (e.g., files, directories, LUNs, data sets) should be subject to compression and/or deduplication. Data reduction techniques such as ILC and ILD are intended to lower the cost per storage unit (e.g., per gigabyte (GB) of storage). However, additional computation costs are incurred at runtime when performing ILC and ILD. For example, CPU or processor time of the data storage system is consumed when performing ILC and ILD. When both ILC and ILD are enabled whereby processing for both ILC and ILD are performed for particular storage entities, a first storage reduction benefit may be obtained. Additionally, a second storage reduction benefit may be obtained when performing only ILC or only ILD. It may be that the first storage reduction benefit obtained (when both ILC and ILD are performed) may not be sufficiently larger than the second storage reduction benefit obtained (when performing only ILC or only ILD) to outweigh the additional CPU cycles/time consumed when both ILC and ILD are performed.

It may be desirable to utilize techniques described in following paragraphs to assess the data reduction efficiency and storage space savings that may be obtained when performing only ILD (without ILC), only ILC (without ILD), and both ILD and ILC. In at least one embodiment, one or more metrics or data reduction statistics may be used to perform such an assessment in an objective manner to selectively activate or enable only compression, only deduplication, both compression and deduplication, or optionally not enable any data reduction. Such selection may be performed automatically or manually (e.g., recommended option determined based on automatic assessment where with user confirmation may be performed prior to enabling or activating the recommended option).

The storage reduction obtained as a result of performing compression and deduplication may have a large intersection or overlap such that performing both compression and deduplication may not result in a larger reduction in storage than performing either individually. More generally, the storage reduction obtained when performing both compression and deduplication for a particular data set may not be sufficiently larger (e.g., by more than a specified threshold) than the storage reduction obtained when performing only ILD or only ILC. In at least one embodiment in accordance with techniques herein, a graphical representation of the storage savings obtained with compression and data deduplication may be presented to a user for one or more data sets. In at least one embodiment, a user may be presented, on a graphical user interface (GUI) display, with a Venn diagram for a data set to graphically illustrate any overlap of reduction benefit in storage obtained with both ILC and ILD. In such an embodiment, a selection may be made to automatically perform only ILD, only ILC, or both ILC and ILD, based on the comparative reduction in storage obtained in all three of the foregoing cases. For example, a selection of a particular data reduction option (e.g., enabling only ILD, only ILC or both ILC and ILD) for a data set may be automatically determined as the particular option resulting the maximum data reduction benefit. A selection may also be made by user input based on the displayed Venn diagram.

Following is an example of metrics or data reduction statistics that may be used in at least one embodiment in accordance with techniques herein. In particular, given specified compression and deduplication ratios denoting the storage savings benefit, processing may be performed to calculate the intersection of the storage reduction savings, as well as other values described herein.

Let $R_c$ denote the compression ratio and $R_d$ denote the deduplication ratio. For a particular data set, $R_c$ may be expressed as:

$$\text{size of data set before compression/size of data set after reduction} \quad \text{EQUATION 1A}$$

For a particular data set, $R_d$ may be expressed as:

$$\text{size of data set before deduplication/size of data set after deduplication} \quad \text{EQUATION 1B}$$

To further illustrate, for a data set, the size before compression may be 100 GB and the size after compression may be 50 GB resulting in an $R_c$ of 2:1=2 or 50% compression savings (e.g., $P_c$ below) or reduction in size due to compression. Furthermore, define the following:

$$R_{cd} = R_c * R_d \text{ Combined Ratio (e.g., combined data reduction ratio)} \quad \text{EQUATION 2}$$

$$P_c = 100 - (100/R_c) \text{ Compression Savings (e.g., percentage of data reduction due to compression)} \quad \text{EQUATION 3}$$

$$P_d = 100 - (100/R_d) \text{ Deduplication Savings (e.g., percentage of data reduction due to deduplication)} \quad \text{EQUATION 4}$$

$$P_{cd} = 100 - (100/R_{cd}) \text{ Combined Savings (e.g., percentage of data reduction based on combined ratio } R_{cd}) \quad \text{EQUATION 5}$$

$$X_{cd} = P_c + P_d - P_{cd} \text{ Intersection of savings of deduplication and compression (e.g., percentage of data reduction shared between/in the intersection/shared of both deduplication and compression)} \quad \text{EQUATION 6}$$

$$X_c = P_c - X_{cd} \text{ Savings unique to compression (e.g., percentage of data reduction unique to compression without intersection/shared data reduction contribution with compression)} \quad \text{EQUATION 7A}$$

Where $X_c$ may also be expressed as:

$$X_c = P_{cd} - P_d \text{ Savings unique to compression (e.g., percentage of data reduction unique to compression without intersection/shared data reduction contribution with compression)} \quad \text{EQUATION 7B}$$

$$X_d = P_d - X_{cd} \text{ Savings unique to deduplication (e.g., percentage of data reduction unique to deduplication without intersection/shared data reduction contribution with compression)} \quad \text{EQUATION 8A}$$

Where $X_d$ may also be expressed as:

$$X_d = P_{cd} - P_c \text{ Savings unique to deduplication (e.g., percentage of data reduction unique to deduplication without intersection/shared data reduction contribution with compression)} \quad \text{EQUATION 8B}$$

Furthermore, based on the foregoing equations, the intersection $X_{cd}$ (Intersection of storage savings or reduction of deduplication and compression as a percentage) may also be expressed in terms of compression and deduplication ratios $R_c$ and $R_d$ as follows in EQUATION 9 below:

$$\begin{aligned} X_{cd} &= P_c + P_d - P_{cd} = (100 - 100/R_c) + \\ & \quad (100 - 100/R_d) - (100 - 100/R_{cd}) \\ &= 100 + (100/R_{cd}) - (100/R_c) - (100/R_d) \\ &= 100/R_{cd} * (1 + R_c * R_d - R_c - R_d) \\ &= (100 * (R_c - 1) * (R_d - 1))/R_{cd} \end{aligned} \quad \text{EQUATION 9}$$

Thus $X_{cd}$ (such as expressed in connection with EQUATIONs 6 and 9) may denote the overlap or intersection of the reduction in storage when both deduplication and compression are performed together for a given data set. Put another way, $X_{cd}$ denotes the data reduction percentage for which both deduplication and compression repeat or duplicate data reduction efforts and thereby overlap (e.g., if only one of deduplication or compression is enabled, the data set would still be reduced by the percentage $X_{cd}$). The foregoing equations illustrate examples of data reduction metrics or statistics that may be calculated and used in connection with techniques herein.

For example, to further illustrate for a first data set, assume the first data set is reduced by 50% when only compression (without deduplication) is performed, and assume the data set is reduced by 50% when only deduplication (without compression) is performed. Then, based on the above data reduction statistics and equations:

$R_c = 2$ $R_d = 2$ $R_{cd} = 2*2 = 4$ $X_{cd} = 100*(2-1)*(2-1)/4 = 25\%$ $X_c = 50\% - 25\% = 25\%$ $X_d = 50\% - 25\% = 25\%$

In connection with the foregoing, $X_c$, $X_d$ and $X_{cd}$ may be useful information in connection with making a decision of whether to perform only ILC, only ILD or both ILC and ILD. Such information may also be used in connection with presenting a Venn diagram to a user on a GUI. In the above example for the first data set, the total percent reduction in storage due to compression of 50% (e.g., when only compression is enabled) may be determined by adding $X_c$, 25%, and $X_{cd}$, 25%; the percent reduction in storage due to deduplication (e.g., when only deduplication is enabled) may be determined by adding $X_d$ and $X_{cd}$; and the total percent reduction in savings when both compression and deduplication are performed (e.g. when both compression and deduplication are enabled and activated for the data set) is 75% which may be determined by adding $X_c$, $X_d$ and $X_{cd}$ (e.g., 25%+25%+25%). Based on the foregoing, the system may automatically determine that the maximum data reduction of 75% may be obtained when both deduplication and compression are performed, as compared to a 50% data reduction when either compression or deduplication are performed alone. The intersection or overlap in data reduction $X_{cd}$ when both compression and deduplication are enabled for the data set denotes the percentage of reduction for which no net additional data reduction is obtained when both are enabled versus enabling only one of compression or deduplication.

In at least one embodiment, processing may automatically evaluate and select a data reduction option that results in the maximum data reduction based on the foregoing calculations The possible data reduction options from which selection may be made include only performing data duplication (e.g., only ILD), only performing compression (e.g. only ILC), performing both compression and deduplication (e.g., ILC and ILD), or otherwise not performing any data reduction technique (e.g., disabling both ILD and ILC). In the above example, such processing may determine that performing both compression and deduplication results in the maximum data reduction of 75% (e.g., maximum data reduction of all available options including 50% reduction for ILD only and 50% reduction for ILC only). Such information, along with the $X_{cd}$ denoting the shared or overlap in reduction benefits, may be presented to a user in a Venn diagram as discussed below.

In at least one embodiment, processing may include automatically making such a selection and implementing (e.g., automatically) the selection to enable both compression and deduplication for the first data set in the above-noted example. As a variation, rather than automatically implement the best determined selection achieving the maximum data reduction based on calculations performed, an embodiment may provide the selection as a recommendation to the user and ask the user for confirmation to proceed with the recommended selection to enable both compression and deduplication, or otherwise select a different data reduction option for the data set (e.g., either select no reduction technique, compression-only, or deduplication-only). Additionally, a Venn diagram such as illustrated in FIG. 3 discussed below may be presented to the user to provide the user with a graphical representation of the data reduction benefits of the different options.

Figure 3:
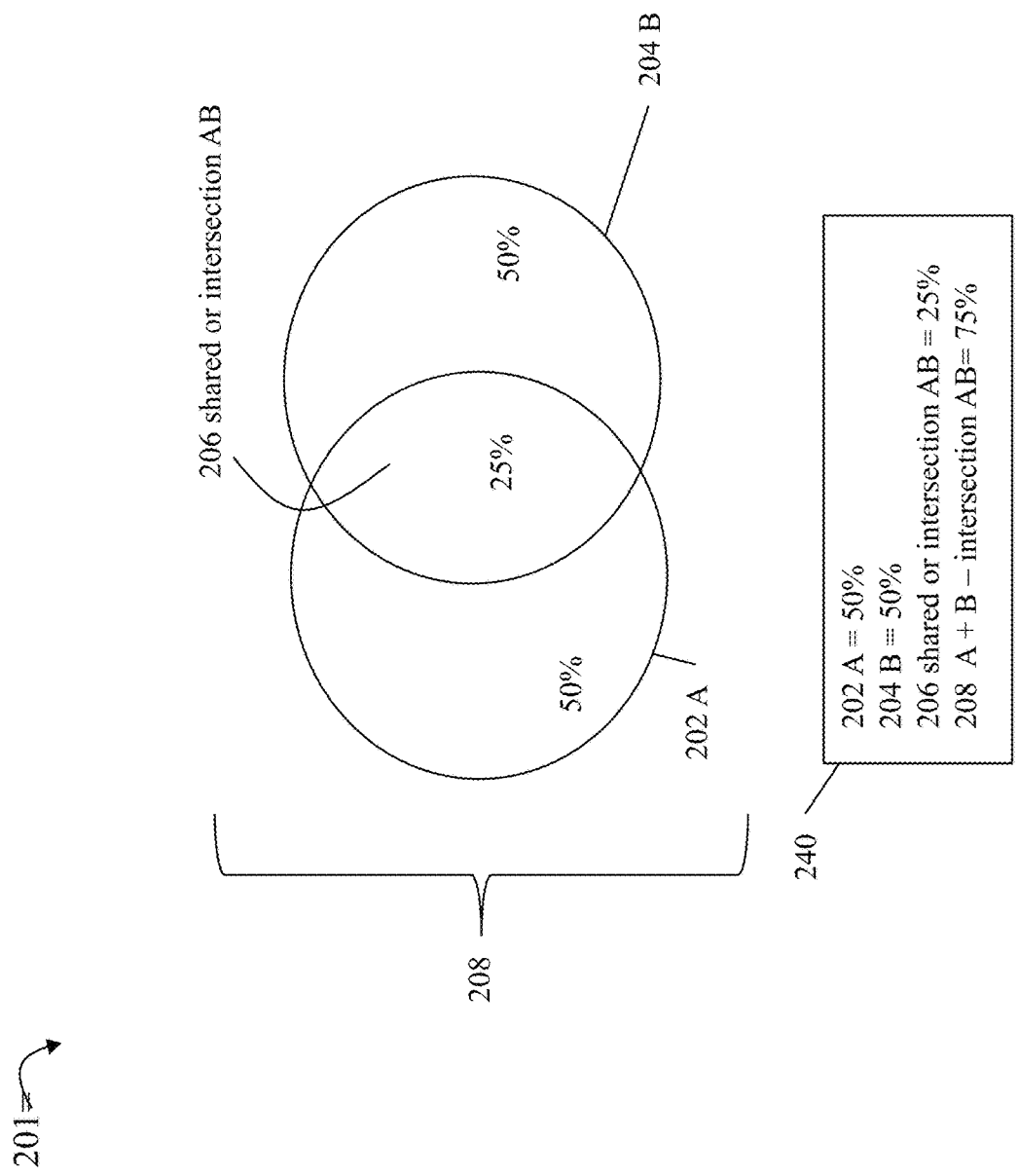
FIGS. 3, 5 and 6 are examples illustrating data reduction information that may be displayed to a user in an embodiment in accordance with techniques herein for different data sets.

Referring to FIG. 3, shown is an example 201 of information that may be presented to the user in an embodiment in accordance with techniques herein. The example 201 illustrates a representation of a Venn diagram that may be presented to the user in connection with the above-noted first data set and associated data reduction benefits obtained with deduplication and compression. Element 202 A denotes the 50% reduction obtained in connection with enabling compression only (e.g., ILC only) for the first data set. Element 204 B denotes the 50% reduction obtained in connection with enabling deduplication only (e.g., ILD only) for the first data set. Element 206 denotes the 25% overlap in reduction benefits obtained when both compression and deduplication are performed (e.g., both ILC and ILC enabled or activated at the same time) for the first data set. In this case, element 208 (denoting the collective or aggregate of 202, 204 and 206) graphically illustrates that a net aggregated 75% data reduction may be obtained when both deduplication and compression are performed for the first data set (e.g., 50% benefit in reduction A+50% reduction B−25% overlap). Element 240 summarizes the information presented graphically in the example 201. It should be noted that the information in 240 may, or may not, be explicitly or additionally presented to the user. It should be noted that elements A 202 and B 204 are circles used to graphically illustrate and denote the data reduction benefits obtained, respectively, for compression and deduplication. However, generally, in FIG. 3 and other Venn diagrams of FIGS. 5 and 6, other shapes may be used to illustrate the benefits and overlap or intersection 206 therebetween.

Figure 4:
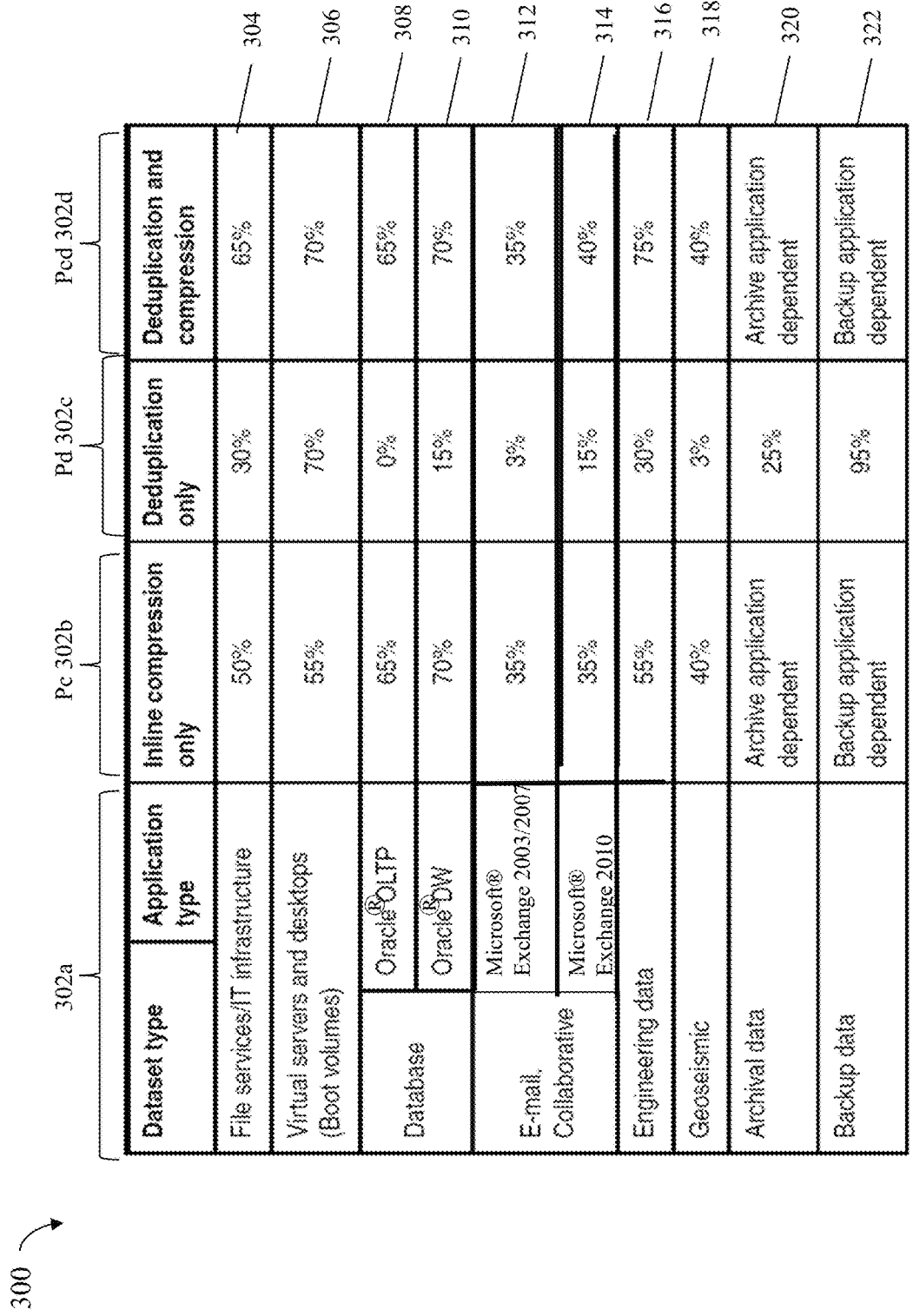
FIG. 4 is an example of a table of data reduction statistic values for different data sets in an embodiment in accordance with techniques herein.

Referring to FIG. 4, shown is a table 300 of values for different data reduction statistics for different data sets that may be used in an embodiment in accordance with techniques herein. The table 300 includes 4 columns of information: a first column 302a identifying characteristics of the data set such as based on a data set type and application type; a second column 302b of a percentage of data reduction for ILC only (e.g., $P_c$ values); a third column 302c of a percentage of data reduction for ILD only (e.g., PD values); and a fourth column 302d of a percentage of data reduction when both ILC and ILD are enabled for the data set (e.g., $P_{cd}$ values). Each row of the table 300 specifies a set of values for $P_c$, $P_d$ and $P_{cd}$ for the particular data set characterized by 302a. In one aspect, the values in columns 302b, 302c and 302d for the different data sets identified in column 302a may be typical, average or expected data reduction benefits for the different data sets identified in 302a. Values 302b, 302c and 302d for the different data sets identified in 302a may be determined in any suitable manner such as, for example, based on expertise, knowledge and usage of the different data sets and data reduction benefits achieved based on historical usage. The table 300 may be a predetermined table of values provided, for example, by a data storage vendor or third party based on historical usage of data reduction benefits achieved using ILC and/or ILD in a data storage system.

Column 302a generally describes the data set based on data set type and/or application type. The data set type may denote the particular usage of the data set and what kind of data is stored in the data set. For example, the data set type may denote whether the data set includes files, directories, and the like, used with file services such as NFS (network file system) or IT (information technology) infrastructure (e.g., row 304, column 302a), virtual machine data such as storage volumes used with virtual servers and user application data used in virtualized environments (e.g., row 306, column 302a), data for a database (e.g., rows 308 and 310, column 302a), data for an email server or application or collaborative software (e.g., rows 312 and 314, column 302a), engineering data (e.g., generally numerical data used with different engineering applications such as VLSI for circuit design; row 316, column 302a), geoseismic data (e.g., numerical sensor data obtained in connection with seismic events such as tremors, earthquakes; row 318, column 302a), archival data (e.g., data that has been archived whereby it may be older and not frequently accessed data; row 320, column 302a), and backup data (e.g., data generated through use of back-up applications such as for backups made hourly, daily, weekly, and the like; row 322, column 302a).

Additionally, a row of the table 300 may further include in column 302a an application type, vendor and/or version, if applicable, to further characterize or identify the data set. For example, rows 308 and 310 both include data sets for a "database" data set type. Row 308 values are further identified as applying for use with a database for a particular application type and vendor, such as Oracle® OLTP (online transaction processing), and row 310 values are further identified as applying for use with a database for a particular application type and vendor, such as Oracle® DW (data warehouse) which includes snapshots of one or more databases. Rows 312 and 314 both include data sets for an email or collaborative software data set type. Row 312 values are further identified as applying for use with an email application by a particular application type, vendor and/or version, such as Microsoft® Exchange 2003/2007, and row 314 values are further identified as applying for use with another email application by a different application type, vendor and/or version, such as Microsoft® Exchange 2010.

A row of the table 300 may not include one or more typical values for a listed data set if, such values may vary, for example, due to dependencies on the particular application used as well as the particulars of the type of data in the data set used with the application. For example, rows 320 and 322 do not specify any typical or expected values for 302b and 302d since such values may vary due to dependency, respectively, on the particular archive application and backup application utilized to obtain the data sets. However, typical deduplication data reduction percentages Pd 302c may be specified for archival data and backup data (e.g., backup data typically has a high rate of data duplicates such as 95% since the data set may include multiple versions of the same files or other storage objects).

Figure 5:
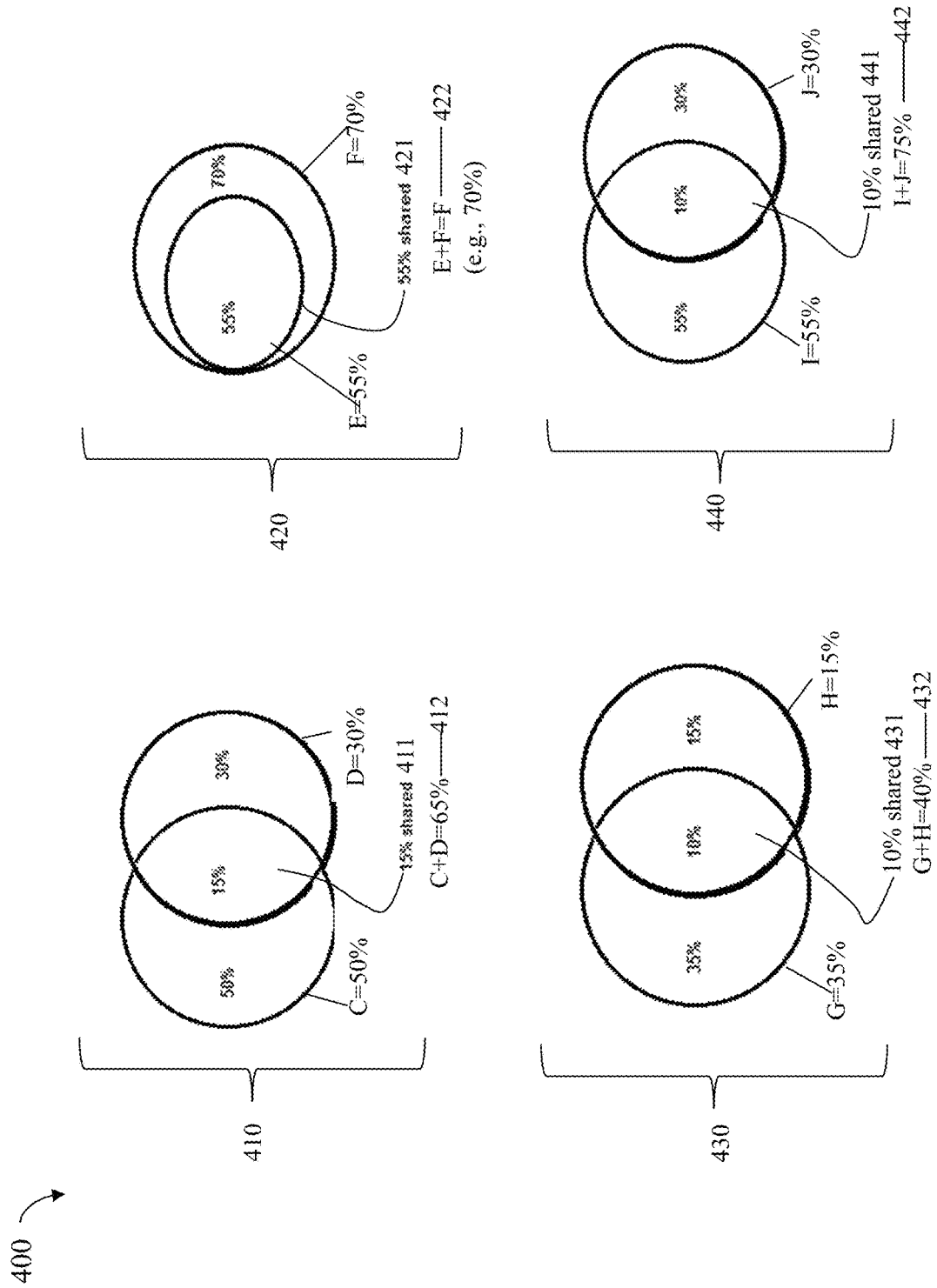
Figure 6:
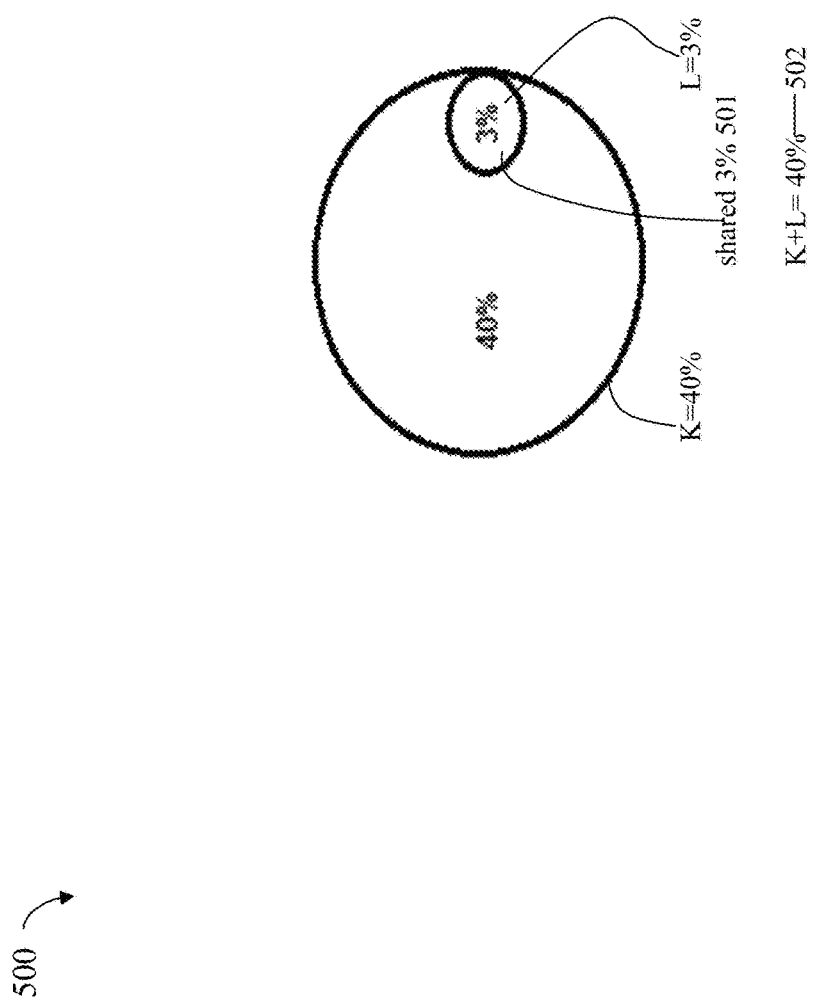

Referring to FIGS. 5 and 6, shown are further examples of information that may be presented to the user in an embodiment in accordance with techniques herein. The examples 400 of FIG. 5 and 500 of FIG. 6 illustrate a representation of a Venn diagram that may be presented to the user, such as in a GUI, in connection with different ones of the above-noted data sets of the table 300 of FIG. 4 to graphically illustrate associated data reduction benefits obtained with deduplication and compression.

Element 410 of FIG. 5 denotes information that may be presented to illustrate data reduction benefits obtained in connection with a data set characterized by row 304 of table 300, such as for file services or IT infrastructure. Element C denotes the 50% reduction obtained in connection with enabling compression only (e.g., ILC only) for the data set characterized by row 304. Element D denotes the 30% reduction obtained in connection with enabling deduplication only (e.g., ILD only) for the data set characterized by row 304. Element 411 denotes the 15% shared or overlap in reduction benefits obtained when both compression and deduplication are performed (e.g., both ILC and ILC enabled or activated at the same time) for the data set. In this case, element 410 (denoting the collective or aggregate of C, D and 411) graphically illustrates that a net aggregated 65% data reduction 412 may be obtained when both deduplication and compression are performed for the data set (e.g., 50% benefit in reduction C+30% reduction D-15% overlap).

Element 420 of FIG. 5 denotes information that may be presented to illustrate data reduction benefits obtained in connection with a data set characterized by row 306 of table 300, such as for virtual servers, virtual machines and other storage of virtualized environments. Element E denotes the 55% reduction obtained in connection with enabling compression only (e.g., ILC only) for the data set characterized by row 306. Element F denotes the 70% reduction obtained in connection with enabling deduplication only (e.g., ILD only) for the data set characterized by row 306. Element 421 denotes the 55% shared or overlap in reduction benefits obtained when both compression and deduplication are performed (e.g., both ILC and ILC enabled or activated at the same time) for the data set. In this case, element 420 (denoting the collective or aggregate of E, F and 421) graphically illustrates that a net aggregated 70% data reduction 422 may be obtained when both deduplication and compression are performed for the data set (e.g., 55% benefit in reduction E+70% reduction F−55% overlap).

Element 430 of FIG. 5 denotes information that may be presented to illustrate data reduction benefits obtained in connection with a data set characterized by row 314 of table 300, for an email application server such as Microsoft® Exchange 2010. Element G denotes the 35% reduction obtained in connection with enabling compression only (e.g., ILC only) for the data set characterized by row 314. Element H denotes the 15% reduction obtained in connection with enabling deduplication only (e.g., ILD only) for the data set characterized by row 314. Element 431 denotes the 10% shared or overlap in reduction benefits obtained when both compression and deduplication are performed (e.g., both ILC and ILC enabled or activated at the same time) for the data set. In this case, element 430 (denoting the collective or aggregate of G, H and 431) graphically illustrates that a net aggregated 40% data reduction 432 may be obtained when both deduplication and compression are performed for the data set (e.g., 35% benefit in reduction E+15% reduction F−10% overlap).

Element 440 of FIG. 5 denotes information that may be presented to illustrate data reduction benefits obtained in connection with a data set characterized by row 316 of table 300, such as for engineering data. Element I denotes the 55% reduction obtained in connection with enabling compression only (e.g., ILC only) for the data set characterized by row 316. Element J denotes the 30% reduction obtained in connection with enabling deduplication only (e.g., ILD only) for the data set characterized by row 316. Element 441 denotes the 10% shared or overlap in reduction benefits obtained when both compression and deduplication are performed (e.g., both ILC and ILC enabled or activated at the same time) for the data set. In this case, element 440 (denoting the collective or aggregate of I, J and 441) graphically illustrates that a net aggregated 75% data reduction 442 may be obtained when both deduplication and compression are performed for the data set (e.g., 55% benefit in reduction I+30% reduction J−10% overlap).

The example 500 of FIG. 6 denotes information that may be presented to illustrate data reduction benefits obtained in connection with a data set characterized by row 318 of table 300, such as for geoseismic data. Element K denotes the 40% reduction obtained in connection with enabling compression only (e.g., ILC only) for the data set characterized by row 318. Element L denotes the 3% reduction obtained in connection with enabling deduplication only (e.g., ILD only) for the data set characterized by row 318. Element 501 denotes the 3% shared or overlap in reduction benefits obtained when both compression and deduplication are performed (e.g., both ILC and ILC enabled or activated at the same time) for the data set. In this case, the example 500 of FIG. 5 (denoting the collective or aggregate of K, L and 501) graphically illustrates that a net aggregated 40% data reduction 5022 may be obtained when both deduplication and compression are performed for the data set (e.g., 40% benefit in reduction K+3% reduction L−3% overlap).

For each particular data set, or more generally, each of the different storage entities or logical groups of such entities, any suitable technique may be used to determine the compression ratio $R_c$ and the deduplication ratio $R_d$ used in the above-noted calculations and metrics in processing in connection with techniques herein to select a data reduction option for the data set. For example, a stand-alone tool (e.g., program) may be used which scans the data set, or selected one or more portions of the data set, to determine values for $R_c$, $R_d$ and other data reduction statistics described herein. The tool may be executed offline, or more generally, without comparing actual data set size reduction as a result of I/Os issued over the I/O or data path. For example, the tool may be executed as a background process when the CPU utilization is low or idle. The tool may be executed, for example, to process data sets to which no I/Os have been issued. The tool may traverse different data sets, may assess or simulate the expected data reduction benefit that would be obtained using deduplication and/or compression, and may calculate $R_c$ and $R_d$ for each such data set (e.g., without actually having performed I/Os and ILC and ILD) in the data set). The tool may traverse the entire data set, or selected portions of the data set, to determine $R_c$ and $R_d$ values for the data set. Using such $R_c$ and $R_d$ values for the data set, different data reduction statistics such as described in FIG. 3 and elsewhere herein may be further calculated and used to select the best data reduction option to enable for the data set for inline data reduction. The selected data reduction option (e.g., compression-only, deduplication-only, both deduplication and compression, or no reduction enabled) for the data set may be determined in any suitable manner, some of which are described herein. For example, the option automatically selected and enabled for the data set may result in the maximum data reduction of the original data set of all available data reduction options. As a variation, information such as described above and in the example of FIG. 3 may be presented to a user with a recommendation of which data reduction option to select (to obtain maximum data reduction), where the user may confirm the selected recommended option, or otherwise select a different option for data reduction to be enabled for the data set. Additionally, such recalculation of $R_c$ and $R_d$ and other data reduction statistics by the tool may be periodically performed at subsequent time periods to reassess the currently selected data reduction option. In this manner, the particular data reduction option recommended and enabled for a data set may change over time as the tool reperforms its processing and analysis. For example, an initial determination of $R_c$ and $R_d$ may result in recommending and enabling only compression to achieve the maximum data reduction for the data set from all available data reduction options. After a time period, the tool may again traverse the data set, or portions of it, and determine updated values for $R_c$ and $R_d$. Such updated values for $R_c$ and $R_d$ may be used to calculate revised data reduction statistics such as described herein and in connection with FIG. 3 whereby the maximum data reduction is now determined by selecting and enabling both compression and deduplication. As a result, both compression and deduplication may be enabled for the data set after the time period. In a similar manner, the tool may periodically reassess the data set at different subsequent points in time and further enable or disable ILC and/or ILD based on revised $R_c$, $R_d$ and other data reduction statistics determined at such points in time.

As another second technique, the $R_c$ and $R_d$ values for a data set may be based on the reduction in size of the data set during a time period when data reduction is enabled or "on" for the data set and when actual I/Os are issued to the data set. In this second technique, both ILC and ILD may be initially enabled for the data set for a time period. At the end of the time period, values for $R_c$ and $R_d$ and other data reduction statistics such as illustrated and described herein and in connection with FIG. 3 may be determined based on actual reduction in data set size obtained for writes to the data set during the time period (e.g., based on observed I/Os to determine when a write resulted in deduplicating or compressing data). Such values for the data reduction statistics may be used to automatically select the data reduction option that results in the maximum data reduction of the data set. Alternatively, such values may be included in information presented to the user for confirmation of a recommended best option or selection of an alternative data reduction option for the data set. At a subsequent point in time, such recalculation of $R_c$ and $R_d$ and other data reduction statistics described herein may be repeated for the data set using the tool and/or based on the resulting data set size for a particular option that has been enabled for inline I/O processing for the data set during the subsequent time period. The currently selected data reduction option may be revised based on the recalculated $R_c$, $R_d$ and other data reduction statistics (e.g., revised option selected automatically or based on user input such as described above in connection).

As yet another variation, the tool may be executed to determine initial values for $R_c$, $R_d$ and other data reduction statistics herein for a data set, and a data reduction option may be selected and initially enabled for the data set based on such data reduction statistics. Such initial values for $R_c$ and $R_d$ may be revised and updated over time as I/Os are subsequently issued to the data set. Processing may periodically recalculate $R_c$, $R_d$ and other data reduction statistics for the data set based on data set size reduction achieved as a result of actual I/Os issued over the I/O or data path when compression and/or deduplication are enabled as part of inline I/O path processing. Alternatively, the tool may be used to determine revised values for $R_c$ and/or $R_d$ and other data reduction statistics, for example, by scanning the data set if a particular data reduction technique (compression or deduplication) is currently not enabled during the time period. In this manner, $R_c$, $R_d$ and other data reduction statistics, and the determination of the data reduction technique(s) enabled/disabled (e.g., via user selection or automatic selection to achieve maximum data reduction) may be updated over time as the content or user data of the data set may change over time.

As yet another technique in connection with determining $R_c$ and $R_d$ values for a data set, there may be a predetermined table of data sets (e.g., similar to the table in FIG. 4) for which default or initial $R_c$ and $R_d$ values may be predetermined or already stored for use with techniques herein. The predetermined data sets may have particular characteristics or attributes such as based on the data set type and application type as illustrated in 302a. Initial values for $R_c$ and $R_d$ for a new data set may be determined, such as by selecting one of the predetermined data set types or rows of the table of FIG. 4 having attributes or characteristics most closely matching those of the new data set, and then using the default $R_c$, $R_d$ and other statistical values for the selected row as the initial values for the new data set. Subsequently, revised values for $R_c$, $R_d$ and other data reduction statistics for the new data set may be determined after a time period during which I/Os have been issued to the data set. At the end of the time period, revised values for $R_c$, $R_d$ and other data reduction statistics described herein may be calculated for the data set using the tool and/or based on the actual size reduction experienced by the data set during the time period (e.g., if ILD is enabled during the time period, the actual size reduction of the data set may be used to determine the revised $R_d$; if ILC is enabled during the time period, the actual size reduction of the data set may be used to determine the revised $R_c$; if both ILD and ILC are enabled during the time period, the actual size reduction of the data set may be used to determine the revised $R_c$, $R_d$ and $R_{cd}$). Based on the revised values, the currently selected data reduction option (e.g., whether each of deduplication and data reduction are enabled or disabled) may be revised (e.g., via user selection or automatic selection of option that achieves maximum data reduction).

In at least one embodiment, the user may be alerted if a change (e.g., within some specified threshold amount) is detected between first and second points in time with respect to the data reduction benefit obtained with deduplication and/or compression for a data set. In response to detecting a change in the level of data reduction obtained for the data set, processing may be performed to revise the data reduction option currently selected and enabled for the data set. Consistent with discussion elsewhere herein, the revised data reduction option may be determined, for example, automatically (e.g., select and enable the option providing the maximum data reduction with respect to all options) Alternatively, the user may be presented with a recommendation of the option that provides the maximum data reduction along with other information, such as displaying a Venn diagram with information as illustrated in FIGS. 3, 5 and 6. The user may then confirm that the recommended data reduction option should be implemented or enabled for the data set, or otherwise make a different selection for the data reduction option (e.g., such as based on the information presented in the Venn diagram denoting the current data reduction information for the data set). It should be noted that the change detected may be with respect to a change in values for one or more specified data reduction statistics (e.g., such as a detected change in one or more of $P_c$, $P_d$, $P_{cd}$, $R_c$, $R_d$, $R_{cd}$, and others described herein).

In connection with determining initial and/or revised data reduction options for a data set, the user can decide which data reduction option and techniques (e.g., ILD only, ILC only, both ILC and ILD, no data reduction) to enable for a data set based on presented information. For example, a user may be presented with information for a data set in a form such as a Venn diagram of FIGS. 3, 5 and 6, and then the user may select an option identifying which data reduction techniques are enabled/disabled for the data set.

In at least one embodiment, a user may specify a minimum data reduction target in order to enable any data reduction technique for one or more data sets. For example, a user may specify a minimum data reduction target of 30% for a data set. In this case, no data reduction option (e.g., ILD only, ILC only, ILC and ILD) may be selected (e.g., automatically) for enablement for the data set unless the selected option achieves at least a 30% data reduction for the data set. Additionally, an embodiment may present the user with the various data reduction options that meet or achieve at least the specified minimum data reduction target and allow the user to select from the one or more presented options.

In at least one embodiment, a user may specify a minimum data reduction additional benefit to be achieved before enabling both ILD and ILC as opposed to ILC-only or ILD only. For example, ILD-only or ILC only may be currently enabled for a given data set. Processing may determine that performing or enabling both ILD and ILC for the data set may result in the maximum data reduction of all available options. However, the user may not want to enable both ILC and ILD for the data set (thereby incurring the additional CPU processing costs) unless there is at least the minimum data reduction additional benefit achieved over the currently enabled option of ILD-only or ILC-only. For example, enabling both ILD and ILC for the data set may result in the maximum data reduction that is only 1% greater than the data reduction achieved when ILC-only or ILD-only is enabled. In this case, the user may select to enable only ILD or only ILC and not enable both ILD and ILC for the data set. Such a minimum value may be used, for example, in automatically specifying and revising data reduction options for a data set when reassessed at various points in time.

Described herein are particular embodiments and techniques that may be used to select a data reduction option enabling and/or disabling different data reduction techniques for one or more data sets. Additionally, such techniques herein may be used in connection with other applications. For example, information obtained regarding data reduction statistics for one or more data sets may be used in connection with capacity planning and provisioning of storage for the data storage system. For example, having an idea regarding the data reduction benefits obtained for different data sets may be used in connection with better estimating an amount of actual physical storage needed to store the data sets. Furthermore, if particular data sets are stored on a particular storage tier or type of storage media (e.g., such as flash-based PDs), the data reduction statistics described herein regarding data reduction benefits may be used in determining the amount of physical storage of the particular tier or storage media type needed for storing the particular data sets.

In at least some cases, a user may not have any knowledge regarding the amount of data reduction that can be achieved using compression (e.g., ILC) and/or data deduplication (e.g., ILD) for a data set. In such a case, initial values for $R_c$, $R_d$ and other data reduction statistics as described herein may be determined for the data set based on typical or default values. Additionally, an initial selection of a data reduction option may be specified for the data set (e.g., where the option identifies what data reduction techniques are enabled and/or disabled for the data set). Reassessment may be performed at one or more later points in time as described herein to learn or measure actual data reduction benefits obtained for the data set and accordingly revise, as needed, the particular data reduction option specified for the data set.

In at least one embodiment, a user may specify an option denoting what data reduction techniques are enabled/disabled for a data set or group of data sets. As new data sets are added which have similar data characteristics of other existing data sets, the currently selected data reduction option for such other existing data sets may be specified as the default or initial option for the new data sets.

Figure 7:
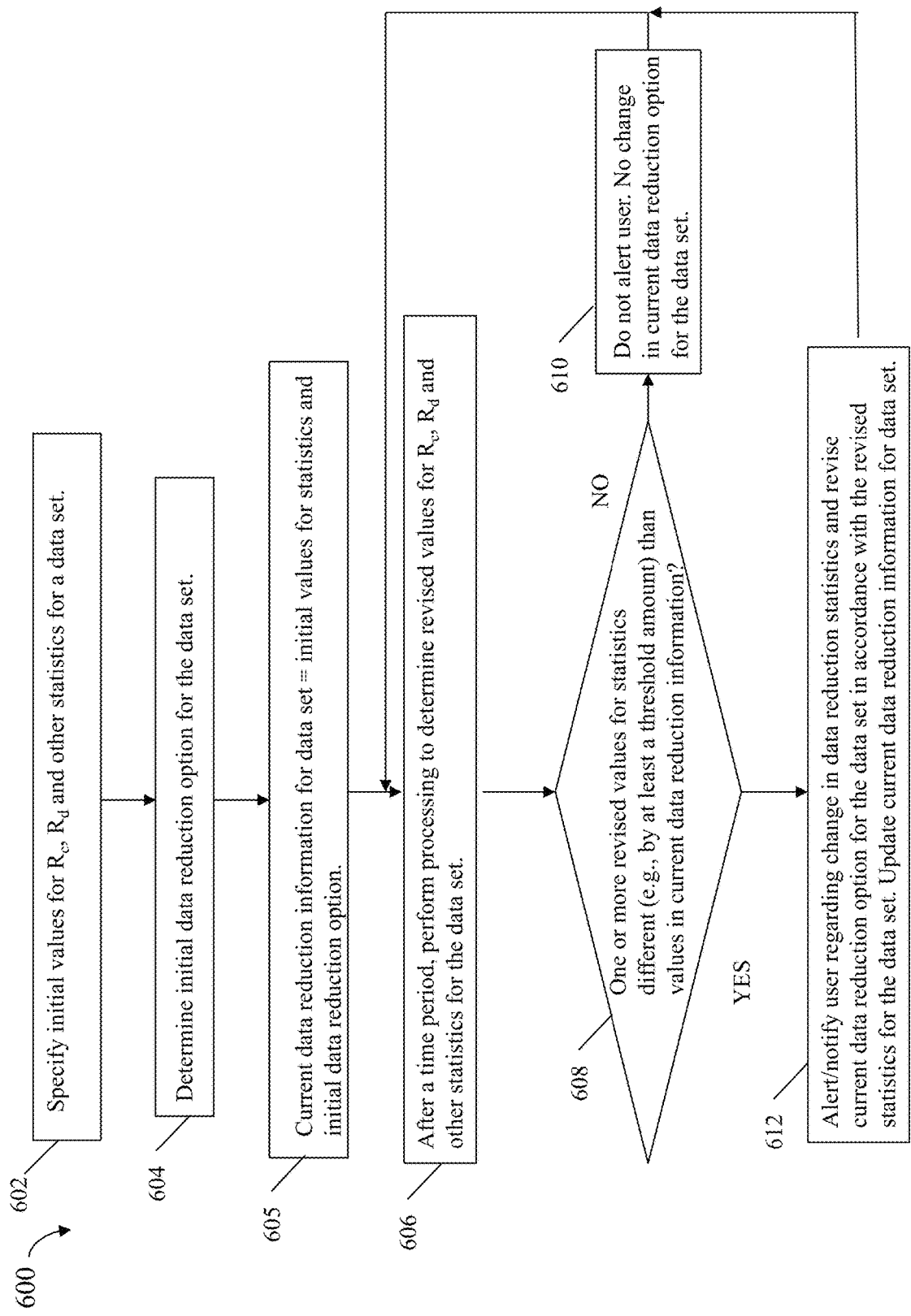
FIG. 7 is a flowchart of processing steps that may be performed in an embodiment in accordance with techniques herein.

Referring to FIG. 7, shown is a flowchart 600 of processing steps that may be performed in an embodiment in accordance with techniques herein. The steps of 600 may be performed with respect to a single data set and generally summarize processing described above. At step 602, initial values for $R_c$, $R_d$ and other data reduction statistics may be determined for the data set. Such initial values may be specified using any suitable technique some of which are described herein. From step 602, control proceeds to step 604 to determine an initial data reduction option (e.g., enable ILD-only, enable ILC-only, enable ILC and ILD, disable both ILD and ILC) for the data set. As described herein, step 604 may generally be performed automatically without user interaction, or with user interaction. In connection with step 604, a graphical illustration of the initial data reduction statistics (determined in step 602) for the data set may be presented to the user, such as one of the Venn diagrams as illustrated in FIGS. 3, 5 and 6. From step 604, control proceeds to step 605. At step 605, current data reduction information for the data may be updated to reflect the initial values for the statistics determined in step 602 and the initial data reduction option determined in step 604 for the data set. Generally, the current data reduction information may reflect the currently selected and enabled data reduction option for the data set and values for the data reduction statistics associated with the currently selected data reduction option. Put another way, the values for the statistics used in determining or selecting the current data reduction option are stored in the current data reduction information for the data set. From step 605, control proceeds to step 606.

At step 606, after a time period during which I/Os may be issued to the data set, processing may be performed to determine revised values for $R_c$, $R_d$ and other data reduction statistics described herein for the data set. Such revised values in step 606 may be determined using any suitable technique some of which are described herein (e.g., based on actual data reduction in the data set and/or using a tool). From step 606, control proceeds to step 608 where a determination is made as to whether one or more revised statistic values differ (e.g., by at least a specified threshold difference) from one or more corresponding values as stored in the current data reduction information for the data set. For example, step 608 may include determining whether current values for $P_c$ and $P_d$ for the data set differ from initial values for $P_c$ and $P_d$ (as specified previously in step 602 and stored in the current data reduction information for the data set in step 605). If step 608 evaluates to no, control proceeds to step 610. In step 610, the user may not be alerted since no change (e.g., by at least the specified threshold difference) has been detected in values for one or more of the data reduction statistics for the data set. If step 608 evaluates to yes, control proceeds to step 612. In step 612, processing may be performed to alert or notify the user regarding the detected change in one or more data reduction statistics. Step 612 processing may also include revising the current data reduction option enabled for the data set in accordance with the detected change(s) and, more generally, in accordance with the revised statistics for the data set (as determined in step 606). Step 612 may also include updating the current data reduction information for the data set to include the revised values for the data reduction statistics (determined in step 606) and also to include the revised data reduction option. It should be noted that selecting the revised data reduction option for the data set in step 612 may be performed automatically without user interaction, or alternatively with user interaction where the data reduction statistics may be presented to the user, for example, in the form of a Venn diagram such as illustrated in connection with FIGS. 3, 5 and 6.

Consistent with discussion herein, reassessment of the data reduction statistics and current data reduction option specified for a data set as described generally in steps 606, 608, 610 and 612 may be repeated in a similar manner at subsequent points in time (e.g., to determine whether there has been a change by at least a threshold amount, compare current values for the data reduction statistics to prior values for the data reduction statistics associated with the currently selected data reduction option). As such, processing from steps 610 and 612 returns to step 606 commence performing the reassessment after another time period has elapsed.

To further illustrate, current data reduction information associated with a data set may denote the currently selected data reduction option (e.g., whether ILD is enabled or disabled, and whether ILC is enabled or disabled) and values for the data reduction statistics calculated and used in determining the currently selected data reduction option. After a first time period, first revised values for the data reduction statistics may be determined and compared to those stored in the current data reduction information. Step 608 may determine that there has been no change or difference in the compared values for the first time period. Subsequently, after a second time period, second revised values for the data reduction statistics may be determined and compared to those stored in the current data reduction information. For the second time period, step 608 may determine that there has a change or difference in at least one of the compared values for the second time period (e.g., a first value for $P_c$ for the second time period has increased in comparison to a prior value for $P_c$ as included in the current data reduction information for the data set. As a result of the detected change for the second time period, ILC-only may be enabled for the data set rather than the currently selected option of ILD-only and the current data reduction information may be updated to include revised values for the data reduction statistics as determined for the second time period.

As a variation from processing described in FIG. 7, step 602 may be omitted and step 604 may include selecting the initial data reduction option for the data set to enable both ILD and ILC and then, in step 606, assessing the data reduction benefits obtained for ILD and ILC based on the actual data reduction of the data set after issuing I/Os to the data for the time period (e.g., collect statistics regarding the observed effect of data reduction techniques ILD and ILC for write I/Os issued to the data set during the time period).

The techniques herein may be performed by executing code which is stored on any one or more different forms of computer-readable media. Computer-readable media may include different forms of volatile (e.g., RAM) and non-volatile (e.g., ROM, flash memory, magnetic or optical disks, or tape) storage which may be removable or non-removable.

While the invention has been disclosed in connection with embodiments shown and described in detail, their modifications and improvements thereon will become readily apparent to those skilled in the art. Accordingly, the spirit and scope of the present invention should be limited only by the following claims.

What is claimed is:

1. A method of determining data reduction options for data sets comprising:
   receiving a first plurality of data reduction statistics for a first data set, the first plurality of data reduction statistics including a first value of a first statistic denoting an amount of data reduction obtained for the first data set when compression is enabled, a second value of a second statistic denoting an amount of data reduction obtained for the first data set when deduplication is enabled, and a third value of a third statistic denoting an overlap in data reduction contribution when both compression and deduplication are enabled, wherein the overlap represented by the third value of the third statistic represents duplicate data reduction repeated by both deduplication and compression; and
   determining, in accordance with the first plurality of data reduction statistics for the first data set, a first setting denoting a current data reduction option enabled for the first data set.

2. The method of claim 1, further comprising:
   determining, in accordance with the first plurality of data reduction statistics for the first data set, a first option of a plurality of different data reduction options that results in a maximum data reduction of the first data set; and
   setting the first setting to the first option thereby denoting that the first option is the current data reduction option enabled for the first data set.

3. The method of claim 2, wherein the plurality of different data reduction options include enabling only compression without deduplication, enabling only deduplication without compression, enabling both compression and deduplication, and disabling both deduplication and compression.

4. The method of claim 1, wherein the first setting denotes whether deduplication is currently enabled or disabled for the first data set and denotes whether compression is currently enabled or disabled for the first data set.

5. The method of claim 4, wherein deduplication when enabled is performed as processing of an I/O path when writing to the first data set, and wherein compression when enabled is performed as processing of the I/O path when writing to the first data set.

6. The method of claim 1, further comprising:
   displaying, on a user interface, a diagram illustrating data reduction benefits for the first data set, the diagram including a first element representing the first value of the first statistic, a second element representing the second value for the second statistic and a third element representing the third value for the third statistic;
   providing, in accordance with the first plurality of data reduction statistics for the first data set, a recommended data reduction option for the first data set; and
   receiving, via the user interface, a first input identifying the first setting as the current data reduction option selected for the first data set.

7. The method of claim 6, wherein the recommended data reduction option is selected from a plurality of different data reduction options and wherein the recommended data reduction option is determined, in accordance with the first plurality of data reduction statistics, as having a maximum data reduction effect on the first data set with respect to the plurality of different data reduction options.

8. The method of claim 1, wherein the first plurality of data reduction statistics includes a fourth value denoting a compression ratio for the first data set and a fifth value denoting a deduplication ratio for the first data set, and the method further comprising:
   determining the fourth value denoting the compression ratio and the fifth value denoting the deduplication ratio using at least one of: a tool that scans at least part of the first data set, and information collected as a result of write I/Os issued on an I/O path of the first data set.

9. The method of claim 8, further comprising:
   calculating the third value of the third statistic, denoting an overlap in data reduction contribution when both compression and deduplication are enabled, using the fourth value denoting the compression ratio for the first data set and the fifth value denoting the deduplication ratio for the first data set.

10. The method of claim 9, further comprising:
    calculating the first value for the first statistic using the fourth value denoting the compression ratio for the first data set; and
    calculating the second value for the second statistic using the fifth value denoting the deduplication ratio for the first data set.

11. The method of claim 10, wherein the first setting denotes the current data reduction option enabled for the first data set at a first point in time, and the method includes:
    determining, at a second point in time subsequent to the first point in time, a second plurality of data reduction statistics for the first data set, wherein the second plurality of data reduction statistics includes a second plurality of values for the first statistic, the second statistic, the third statistic, the compression ratio and the deduplication ratio;
    detecting, at the second point in time with respect to the first point in time, a change in data reduction benefit denoted by at least one of the second plurality of data reduction statistics for the first data set; and
    determining, in accordance with the change detected and in accordance with the second plurality of data reduction statistics for the first data set, a second setting denoting a revised setting of the current data reduction option enabled for the first data set at the second point in time.

12. The method of claim 11, further comprising:
    displaying, on a user interface, a diagram illustrating data reduction benefits for the first data set at the second point in time, the diagram including a plurality of elements denoting values of the second plurality of values for the first statistic, the second statistic and the third statistic;

providing, in accordance with the second plurality of data reduction statistics for the first data set, a recommended data reduction option for the first data set; and receiving, via the user interface, a first input identifying the second setting as the revised setting of the current data reduction option enabled for the first data set at the second point in time.

13. The method of claim 1, further comprising:

selecting an entry from a table, wherein the entry identifies a data set type matching the first data set; and using predetermined values for data reduction statistics associated with the entry as data values for the data reduction statistics included in the first plurality of data reduction statistics for a first data set.

14. A system comprising:

one or more processors; and a memory comprising code stored thereon that, when executed, perform a method of determining data reduction options for data sets comprising:

receiving a first plurality of data reduction statistics for a first data set, the first plurality of data reduction statistics including a first value of a first statistic denoting an amount of data reduction obtained for the first data set when compression is enabled, a second value of a second statistic denoting an amount of data reduction obtained for the first data set when deduplication is enabled, and a third value of a third statistic denoting an overlap in data reduction contribution when both compression and deduplication are enabled, wherein the overlap represented by the third value of the third statistic represents duplicate data reduction repeated by both deduplication and compression; and determining, in accordance with the first plurality of data reduction statistics for the first data set, a first setting denoting a current data reduction option enabled for the first data set.

15. A computer readable medium comprising code stored thereon that, when executed, performs a method of determining data reduction options for data sets comprising:

receiving a first plurality of data reduction statistics for a first data set, the first plurality of data reduction statistics including a first value of a first statistic denoting an amount of data reduction obtained for the first data set when compression is enabled, a second value of a second statistic denoting an amount of data reduction obtained for the first data set when deduplication is enabled, and a third value of a third statistic denoting an overlap in data reduction contribution when both compression and deduplication are enabled, wherein the overlap represented by the third value of the third statistic represents duplicate data reduction repeated by both deduplication and compression; and determining, in accordance with the first plurality of data reduction statistics for the first data set, a first setting denoting a current data reduction option enabled for the first data set.

16. The computer readable medium of claim 15, wherein the method further comprises:

determining, in accordance with the first plurality of data reduction statistics for the first data set, a first option of a plurality of different data reduction options that results in a maximum data reduction of the first data set; and setting the first setting to the first option thereby denoting that the first option is the current data reduction option enabled for the first data set.

17. The computer readable medium of claim 16, wherein the plurality of different data reduction options include enabling only compression without deduplication, enabling only deduplication without compression, enabling both compression and deduplication, and disabling both deduplication and compression.

18. The computer readable medium of claim 15, wherein the first setting denotes whether deduplication is currently enabled or disabled for the first data set and denotes whether compression is currently enabled or disabled for the first data set.

19. The computer readable medium of claim 18, wherein deduplication when enabled is performed as processing of an I/O path when writing to the first data set, and wherein compression when enabled is performed as processing of the I/O path when writing to the first data set.

20. The computer readable medium of claim 15, wherein the method further comprises:

displaying, on a user interface, a diagram illustrating data reduction benefits for the first data set, the diagram including a first element representing the first value of the first statistic, a second element representing the second value for the second statistic and a third element representing the third value for the third statistic;

providing, in accordance with the first plurality of data reduction statistics for the first data set, a recommended data reduction option for the first data set; and receiving, via the user interface, a first input identifying the first setting as the current data reduction option selected for the first data set.

* * * * *